United States Patent [19]

Okamura et al.

[11] Patent Number: 5,728,278
[45] Date of Patent: Mar. 17, 1998

[54] PLASMA PROCESSING APPARATUS

[75] Inventors: Nobuyuki Okamura; Atsushi Yamagami, both of Kawasaki; Tadahiro Ohmi, Sendai; Haruhiro Harry Goto, Sendai; Tadashi Shibata, Sendai, all of Japan

[73] Assignee: Canon Kabushiki Kaisha/Applied Materials Japan Inc., Tokyo, Japan

[21] Appl. No.: 340,472

[22] Filed: Nov. 14, 1994

Related U.S. Application Data

[63] Continuation of Ser. No. 200,316, Feb. 23, 1994, abandoned, which is a continuation of Ser. No. 797,925, Nov. 26, 1991, abandoned.

[30] Foreign Application Priority Data

Nov. 29, 1990 [JP] Japan .................................. 2-326075

[51] Int. Cl.$^6$ .................................................. C23C 14/34
[52] U.S. Cl. .................... 204/298.11; 204/298.06; 204/298.07; 204/298.08; 204/298.25; 156/345
[58] Field of Search .................... 204/192.12, 298.06, 204/298.07, 298.08, 298.11, 298.03, 298.32, 298.34, 298.25, 298.33; 118/715, 719; 156/345

[56] References Cited

U.S. PATENT DOCUMENTS

| | | | |
|---|---|---|---|
| 3,594,295 | 7/1971 | Meckel et al. | 204/298.08 X |
| 3,763,031 | 10/1973 | Scow et al. | 204/298.08 |
| 4,038,171 | 7/1977 | Moss et al. | 204/298.06 |
| 4,440,618 | 4/1984 | Suzuki et al. | 204/298.03 |
| 4,500,408 | 2/1985 | Boys et al. | 204/298.03 |
| 4,563,240 | 1/1986 | Shibata et al. | 204/298.38 X |
| 4,572,842 | 2/1986 | Dietrich et al. | 204/298.07 X |
| 4,588,343 | 5/1986 | Garrett | 204/298.25 X |
| 4,818,359 | 4/1989 | Jones et al. | 204/298.06 |
| 4,871,433 | 10/1989 | Wagner et al. | 204/298.06 X |
| 4,874,494 | 10/1989 | Ohmi | 204/298.06 X |
| 4,897,172 | 1/1990 | Katsura et al. | 204/298.06 |
| 4,931,169 | 6/1990 | Scherer et al. | 204/298.11 |
| 4,986,890 | 1/1991 | Setoyama et al. | 204/298.23 X |

*Primary Examiner*—Nam Nguyen
*Attorney, Agent, or Firm*—Fitzpatrick, Cella, Harper & Scinto

[57] ABSTRACT

A plasma processing apparatus has a vacuum container which contains a pair of electrodes for causing a discharge for generating a plasma, and a shielding plate for separating a plasma processing region including a space between the electrodes from a region in contact with the inner wall of the vacuum container in such a manner that both the regions communicate with each other. The apparatus includes a means for causing a pressure difference between the plasma processing region and the region in contact with the inner wall of the vacuum container.

29 Claims, 9 Drawing Sheets

PLASMA PROCESSING APPARATUS

This application is a continuation of application Ser. No. 08/200,316 filed Feb. 23, 1994, now abandoned, which is a continuation of application Ser. No. 07/797,925 filed Nov. 26, 1991, now abandoned.

BACKGROUND OF THE INVENTION

1. Field of the Invention

The present invention relates to a plasma processing apparatus and, more particularly, to a plasma processing apparatus which can be effectively used as an apparatus for forming a deposition film, e.g., a silicon film, an aluminum film, or a silicon oxide film, on a substrate by sputtering in the process of manufacturing a semiconductor or the like.

2. Related Background Art

Sputtering is used as one of methods of forming thin films on a substrate constituted by a semiconductor wafer or the like.

In a general sputtering method, a film is formed as follows. A container (vacuum container) in which a vacuum can be created is evacuated to about $10^{-3}$ to $10^{-2}$ Torr. A DC voltage or RF power is applied to a cathode which opposes an anode and holds a target material to cause a discharge for generating a plasma between the electrodes. Cations are then accelerated to collide with the target material on the cathode by utilizing a cathode drop voltage, and atoms or molecules ejected from the target material are deposited on a substrate.

However, in the formation of a film by means of application of an RF power, if a general parallel, flat type sputtering apparatus is used, a discharge region expands outside the region between the cathode and the anode. As a result, a discharge region which is not used to generate a plasma is created outside the region between the electrodes, resulting in a partial loss in the discharge power applied between the electrodes.

If this power loss is large, a plasma having sufficient density cannot be generated between the electrodes. As a result, an efficient plasma process cannot be performed. In a film forming apparatus, for example, a decrease in plasma density causes a reduction in film formation rate or a decrease in the amount of ions incident on the substrate which are used for a bias sputtering apparatus and the like.

In order to solve the problem of a loss in applied power, applied power may be increased in anticipation of such a power loss. In this method, however, if the applied power is increased, sputtering may occur at undesired portions of the inner wall of the vacuum container and the like to cause ejection of atoms and molecules from the inner wall of the vacuum container and the like, which will adversely affect a plasma process. In a film formation process, for example, atoms or molecules ejected from the inner wall of the vacuum container and the like are mixed, as impurities, with a deposition film, and the amount of such impurities is undesirably increased.

A structure having a shielding plate enclosing the space between the electrodes is known as a structure for preventing a discharge region from expanding outside the space between the electrodes in a plasma processing apparatus so as to reduce a loss in applied power.

However, in a practical plasma process using an RF discharge, since an RF wave applied to the electrode tends to propagate to the shielding plate, a discharge is easily caused between the shielding plate and the inner wall of the vacuum container. That is, this structure does not necessarily provide an efficient plasma process. In addition, a method of applying a voltage to the shielding plate is known as a method of controlling the degree of acceleration or amount of ions which collide with the cathode or preventing sputtering of the shielding plate itself. Even in this method, a loss in RF power to be applied between the electrodes is caused by a discharge between the shielding plate and the inner wall of the vacuum container. Hence, a plasma process is inevitably affected by such a power loss.

A discharge between the shielding plate and the inner wall of the vacuum container can be prevented by reducing the gap therebetween.

It is, however, difficult to arrange the inner wall of the vacuum container to be close to the shielding plate which is positioned near the electrodes. That is, it is difficult in terms of design of an apparatus to reduce the gap between the electrodes and the inner wall of the vacuum container. Furthermore, if the shielding plate is arranged to be close to the inner wall of the vacuum container without reducing the gap between the electrodes and the inner wall of the vacuum container, the gap between the shielding plate and the electrodes is increased, resulting in expansion of the above-mentioned discharge region and an increase in applied power loss.

SUMMARY OF THE INVENTION

The present invention is directed to solve the problems in the above-described conventional plasma processing apparatus, and has as its object to provide a plasma processing apparatus which can efficiently use applied power and can form high-quality deposition films with high productivity.

In order to achieve the above object, according to the embodiments of the present invention, there is provided a plasma processing apparatus having a vacuum container which contains a pair of electrodes for causing a discharge for generating a plasma, and a shielding plate for separating a plasma processing region including a space between the electrodes from a region in contact with an inner wall of the vacuum container in such a manner that both the regions communicate with each other, comprising means for causing a pressure difference between the plasma processing region and the region in contact with the inner wall of the vacuum container.

According to the embodiments of the present invention, since a shielding plate is arranged to enclose a plasma processing region including the space between a pair of discharging electrodes, and a pressure difference is set between the plasma processing region and other regions, expansion of a discharge region generated between the electrodes to the outside of the space therebetween can be prevented. This allows the use of substantially the entire discharge region to generate a plasma required for a plasma process. As a result, an applied power loss can be suppressed so as to perform an efficient plasma process. For example, when such a plasma process is used to form a film, as compared with a case wherein no shielding plate is arranged, a higher film formation rate can be obtained with the same applied power. In addition, a high-quality deposition film can be formed by increasing the proportion of desired ions incident on a substrate.

Furthermore, the shielding plate of the present invention also serves to prevent the formation of a deposition film on the inner wall of the vacuum container, which is the essential object of the shielding plate.

Moreover, by applying a voltage to the shielding plate, the amounts of impurities mixed with a deposition film upon sputtering of the shielding plate itself can be greatly reduced.

DETAILED DESCRIPTION OF THE PREFERRED EMBODIMENTS

Embodiments of the present invention will be described below with reference to the accompanying drawings.

Figure 1:
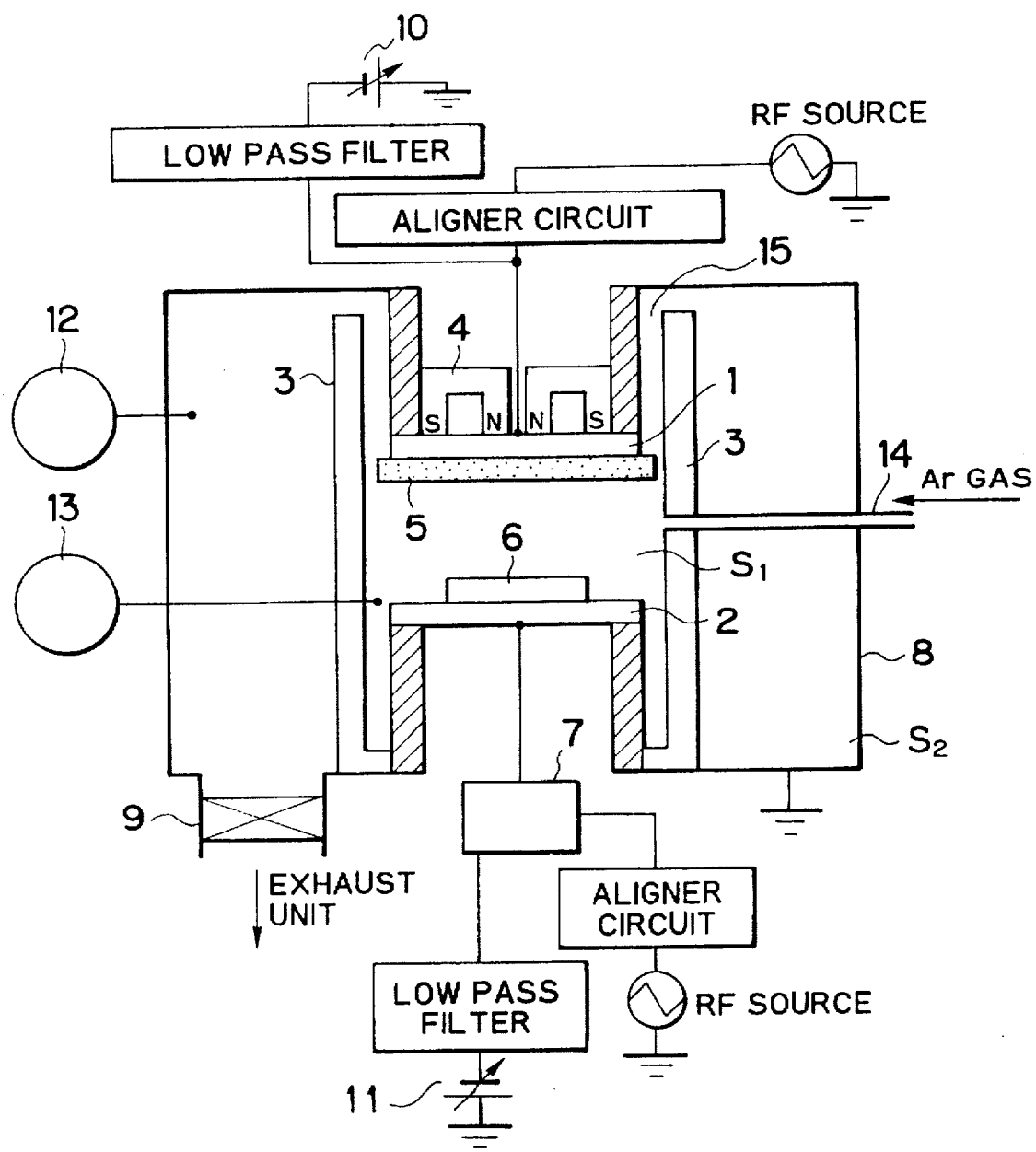
FIGS. 1 to 7 are sectional views showing main parts of plasma processing apparatuses according to the respective embodiments of the present invention.

FIG. 1 is a sectional view showing a main part of a plasma processing apparatus of the present invention, which is used to form a film by sputtering.

A cathode 1 is designed to hold a target material 5. The cathode 1 is connected to a direct current (DC) power source 10 through a low-pass filter (LPF) and to a high-frequency (RF) source as a plasma generation power source through an aligner circuit.

An anode 2 is designed to hold a substrate 6 on which a deposition film is formed. The anode 2 is connected, through a switch 7, either to an RF source through an aligner circuit or to a DC power source 11 through an LPF.

A shielding plate 3 is arranged to enclose a film formation region $S_1$ as a plasma processing region between the cathode 1 and the anode 2. A magnetic field generating means 4 is constituted by a magnet and the like for generating a magnetic field which causes a magnetron discharge on the surface of the target member 5.

In this apparatus, the shielding plate enclosing the space between the electrodes is arranged to be close to the cathode 1 and the anode 2, and the film formation region $S_1$ enclosed by the shielding plate 3 and a region $S_2$ which is located outside the region $S_1$ and is in contact with the inner wall of a vacuum container 8 communicate with each other through a narrow path 15 between the shielding plate 3 and the portion where the cathode 1 is placed. A gas introduction pipe 14 is connected to the film formation region $S_1$ to allow introduction of a gas therein.

With this arrangement, the pressure in the film formation region $S_1$ can be set to be higher than that in the region $S_2$ to cause a pressure difference therebetween by introducing a gas into the region $S_1$ at a predetermined flow rate while regulating the amount of gas flowing from the region $S_1$ to the region $S_2$ through the path 15. As a result, the effect as the object can be obtained by the above-described function.

The positions of the path 15 and the gas introduction pipe 14 and the size and shape of the path 15 are properly set in accordance with the arrangement of the apparatus and the conditions for film formation in such a manner that the shielding plate 3 can be placed as close to the electrodes 1 and 2 as possible, and an effective pressure difference can be set between the film formation region $S_1$ and the region $S_2$.

In this apparatus, a film is formed in the following manner.

The target material 5 and the substrate 6 are respectively set at predetermined positions on the cathode 1 and the anode 2, and the vacuum container 8 is evacuated by an exhaust unit to, e.g., a vacuum of about $1 \times 10^{-7}$ to $3 \times 10^{-9}$ Torr or $3 \times 10^{-9}$ Torr or less.

Subsequently, an Ar gas is introduced into the film formation region $S_1$ through the gas introduction pipe 14 to form a predetermined pressure difference between the region $S_1$ and the region $S_2$.

Note that the pressure of the film formation region $S_1$ is set to be a pressure required for a film formation process, e.g., about $3 \times 10^{-3}$ to $5 \times 10^{-2}$ Torr. In addition, the pressure difference between the film formation region $S_1$ and the region $S_2$ is preferably set such that the ratio of the pressure ($P_{S1}$) in the region $S_1$ to the pressure ($P_{S2}$) in the region $S_2$, i.e., $P_{S1}/P_{S2}$, becomes about 5 to 100.

The feed rate of the Ar gas is regulated such that the vacuum in the film formation region $S_1$ is maintained at a degree required for film formation, and a predetermined pressure difference is formed between the regions $S_1$ and $S_2$.

In this state, RF power and or a DC voltage is applied to the cathode 1, and DC power or RF power is applied to the anode 2 under predetermined conditions.

As a gas to be introduced into the film formation region $S_1$, an inert gas such as He, Ne, Kr, Xe, or Rn, other than the Ar gas, may be used. In addition, such an inert gas may be introduced with an $O_2$ gas to form an oxide film or may be introduced with an $N_2$ or $NH_3$ gas to form a nitride film.

Figure 3:
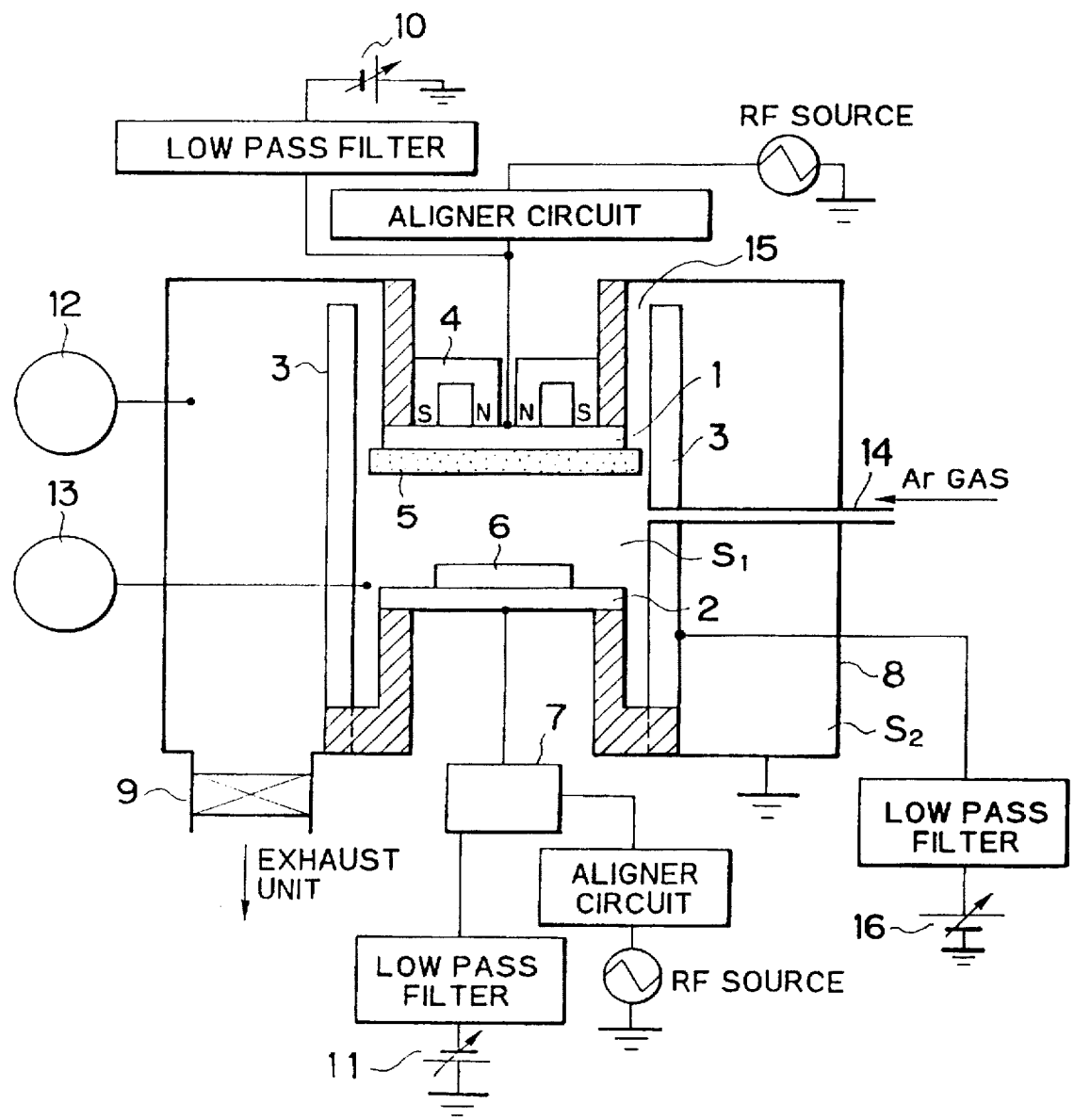

Note that a means capable of applying a voltage may be added to the shielding plate 3 to prevent sputtering of the shielding plate itself. FIG. 3 shows an apparatus having such an arrangement.

The arrangement of the apparatus shown in FIG. 3 is the same as that of the apparatus shown in FIG. 1 except that a DC power source 16 is connected to a shielding plate 3 through an LPF. With regard to the polarities of the DC power source 16, it includes both positive and negative voltages within an application range.

In the film formation process in this apparatus, sputtering of the shielding plate 3 itself can be prevented by applying a predetermined voltage from the DC power source 16 to the shielding plate 3, thereby greatly reducing the amount of atoms or molecules as impurities ejected by sputtering and mixed with a deposition film.

Therefore, the structure which allows application of a voltage to the shielding plate is suitable for the formation of a film required to contain a small amount of impurities.

Figure 4:
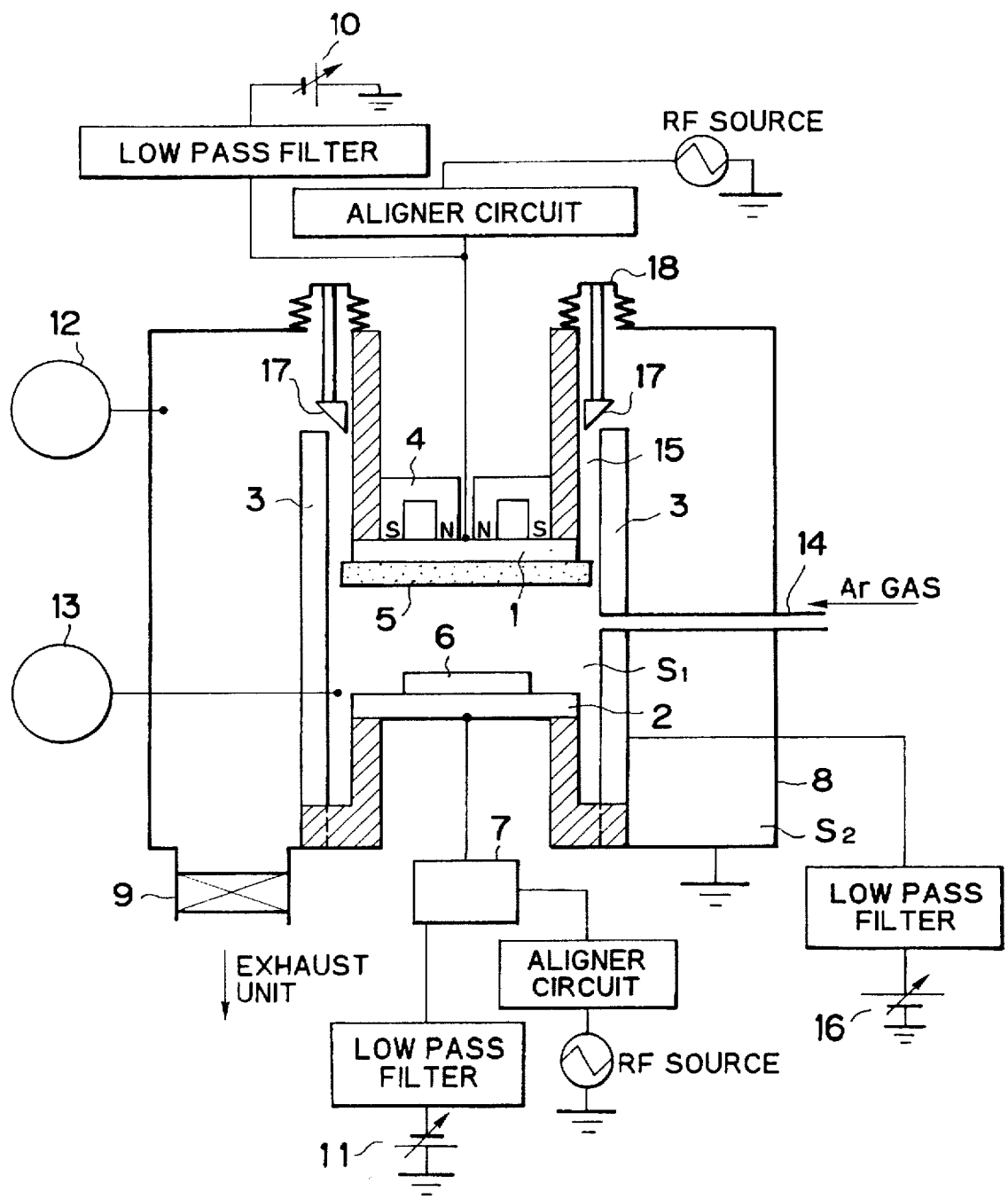

In the above-described apparatus, a path 15 through which a film formation region $S_1$ and a region $S_2$ communicate with each other is fixed. However, as shown in FIG. 4, a regulation valve 17 for regulating the area of the opening portion of a path 15 may be moved by moving bellows 18 up and down to regulate the amount of a gas flowing out through the path 15, thus controlling the pressure difference between the film formation region $S_1$ and the region $S_2$.

Figure 5:
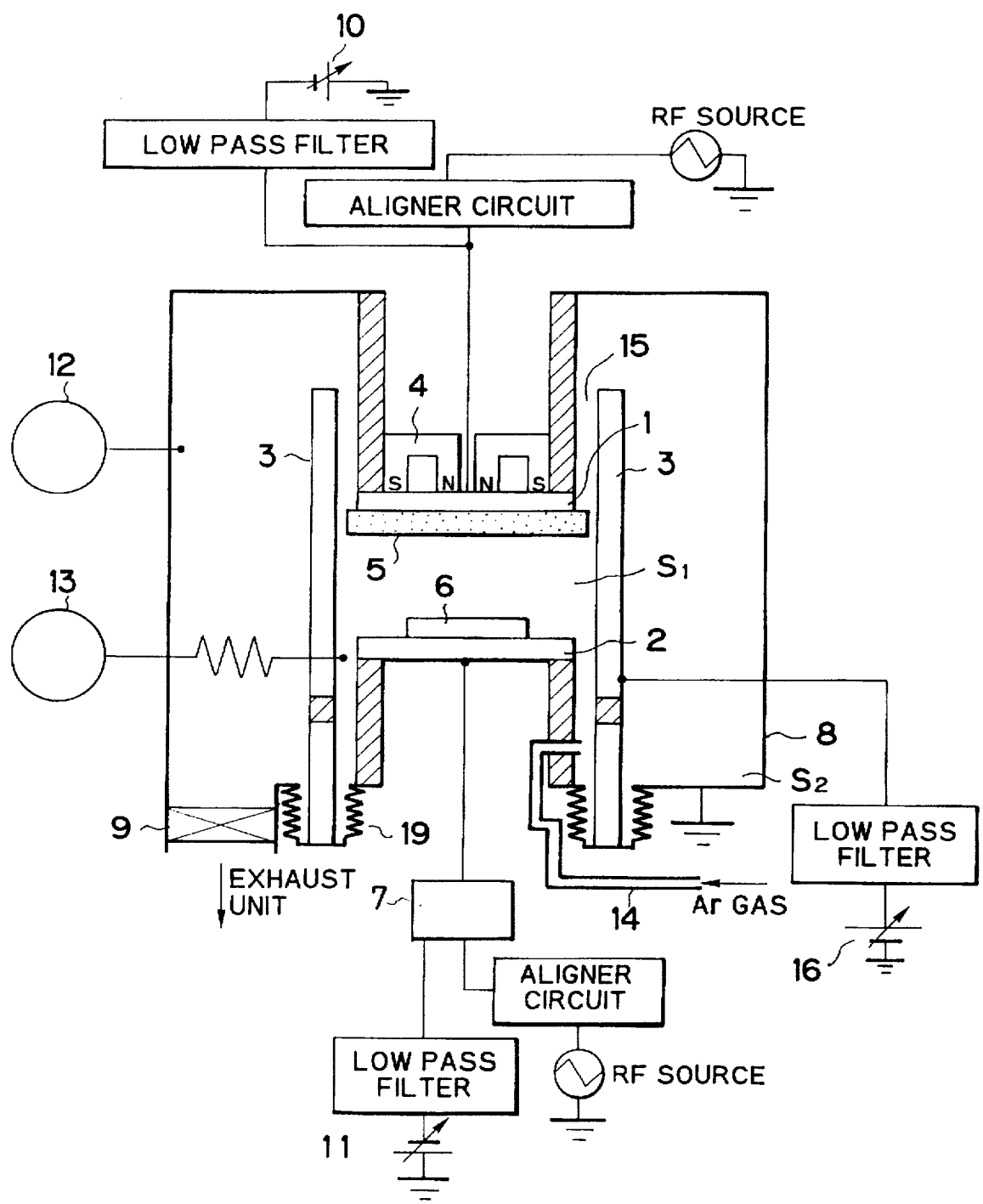
Figure 6:
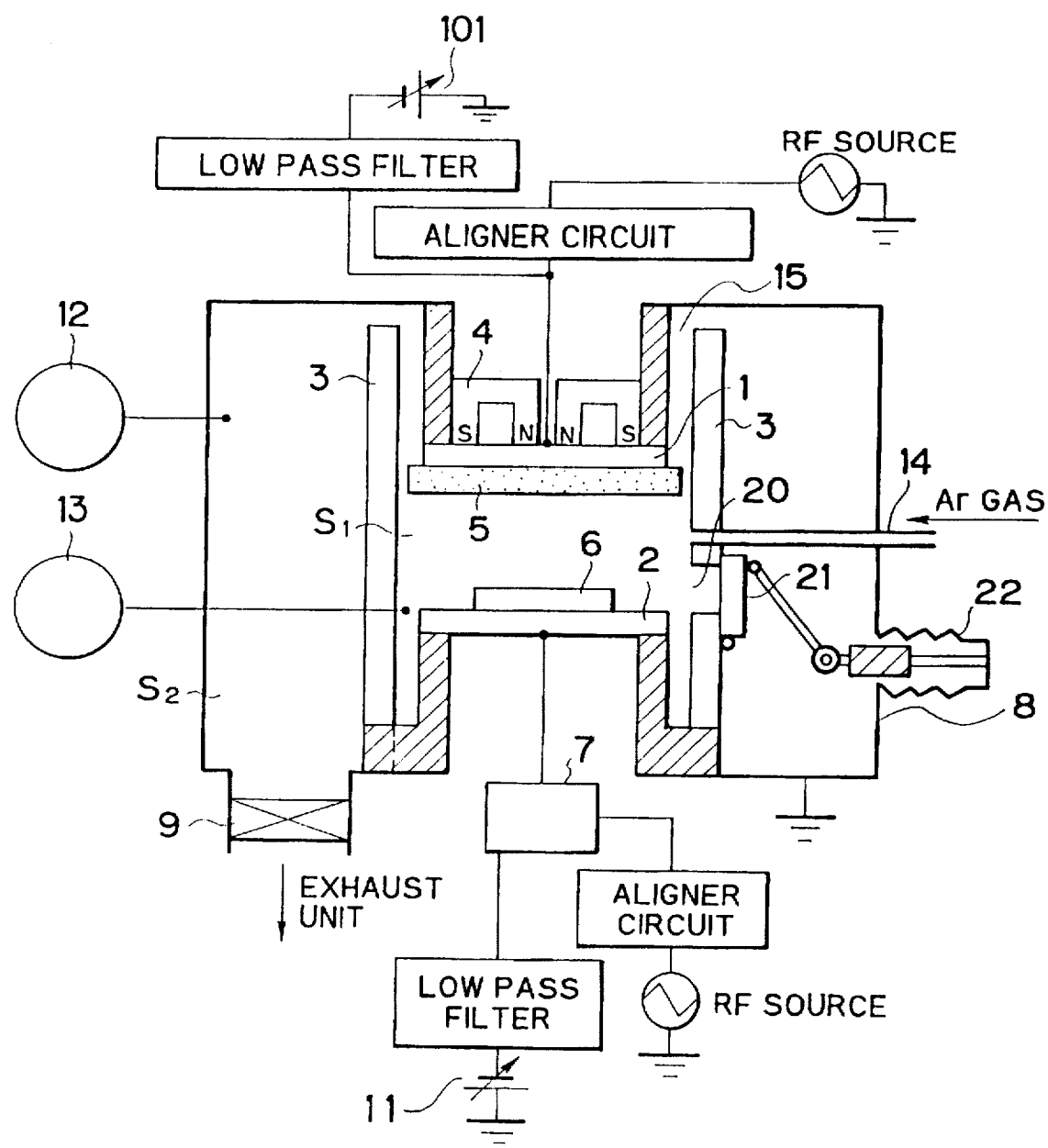
Figure 7:
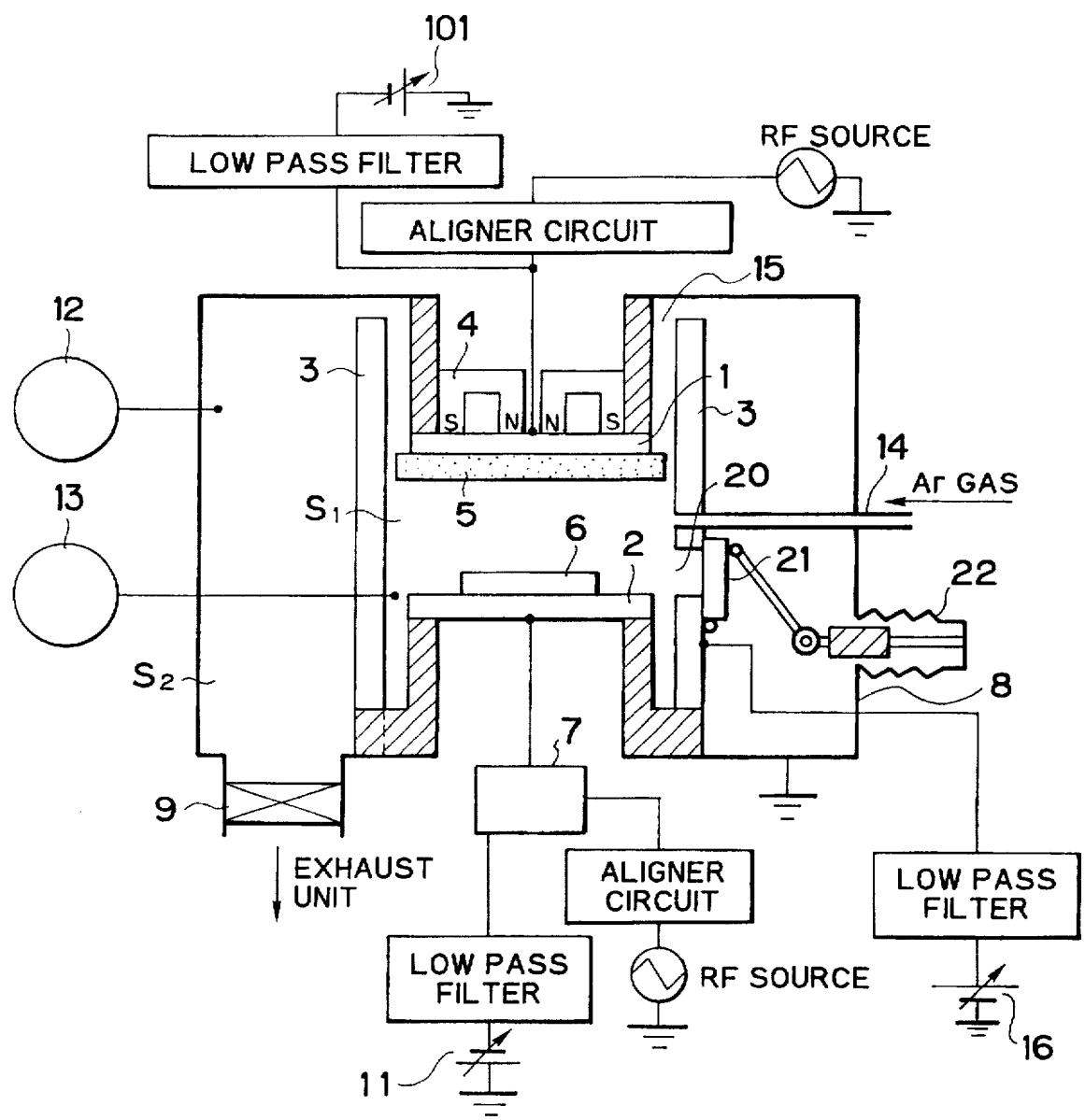

Although a means for loading/unloading a substrate is not shown in the arrangements of the apparatuses shown in FIGS. 1 and 3, for example, bellows 19 may be arranged to vertically move a shielding plate 3, as shown in FIG. 5, or an opening portion 20 and a cover 21 may be arranged such that the cover 21 can be opened/closed, as shown in FIGS. 6 and 7, thereby allowing loading/unloading operations of a target material 5 and a substrate 6.

Note that the apparatus shown in FIG. 6 is different from that shown in FIG. 7 in that a DC power source is not connected to a shielding plate in the former but is connected in the latter.

Furthermore, in the plasma processing apparatus of the present invention, if a load lock chamber is connected to the vacuum container 8, replacement of substrates can be performed without restoring the pressure in the vacuum container 8 to the atmospheric pressure, thus increasing the film formation efficiency.

Various modifications of the plasma processing apparatus of the present invention as a film forming apparatus using the sputtering method have been described above. The arrangement of the plasma processing apparatus of the present invention can be applied to other plasma processes such as a plasma CVD process, a reactive ion etching process, a dry cleaning process, and a resist ashing process.

[EXAMPLES]

Example 1

Figure 2:
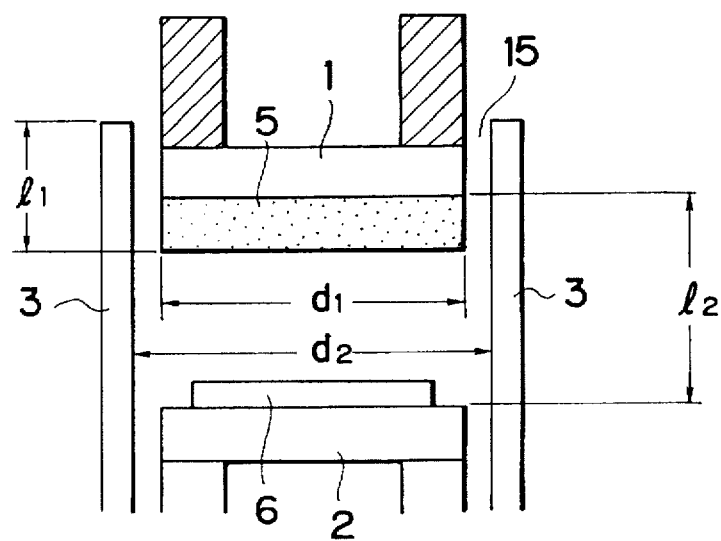

A film forming apparatus based on the sputtering method shown in FIG. 6 was manufactured by setting the sizes of the respective portions shown in FIG. 2 as follows:

diameter $d_1$ of cathode 1 and anode 2=90 mm inner diameter $d_2$ of cylindrical shielding plate=91 mm distance $l_1$ between upper end of cylindrical shielding plate and target material surface=7 mm inter-electrode distance $l_2$=30 mm Note that both the vacuum container 8 and the shielding plate 3 were composed of stainless steel (SUS 316 L), and each of the electrodes 1 and 2 was constituted by a copper member coated with a 50-µm thick Ta film.

A disk-like aluminum plate (diameter: 90 mm; thickness: 5 mm) as the target material 5 was set on the cathode 1. A disk-like silicon wafer (diameter: 50 mm; thickness: 0.4 mm) as the substrate 6 was set on the anode 2. The exhaust unit was then started to set a vacuum of $2\times10^{-9}$ Torr in the vacuum container 8. At this time, an Ar gas was introduced through the gas introduction pipe 14 at a flow rate of 30 SCCM. When the pressures in the film formation region $S_1$ and the region $S_2$ were stabilized, these pressures were respectively measured by pressure gages 12 and 13. The pressure in the film formation region $S_1$ was 7 mTorr, and the pressure in the region $S_2$ was 0.1 mTorr.

In this state, an aluminum deposition film was formed on the silicon wafer substrate 6 under the following conditions:

RF wave (applied from the RF source to the cathode 1):
frequency=13.56 MHz
applied power=values shown in Table 1

Voltage of anode 2:
ground voltage (0 V)

Substrate temperature: 100° C.

Film formation rates at the respective values of power were measured. Table 1 shows the measurement result.

Comparative Example 1

Figure 8:
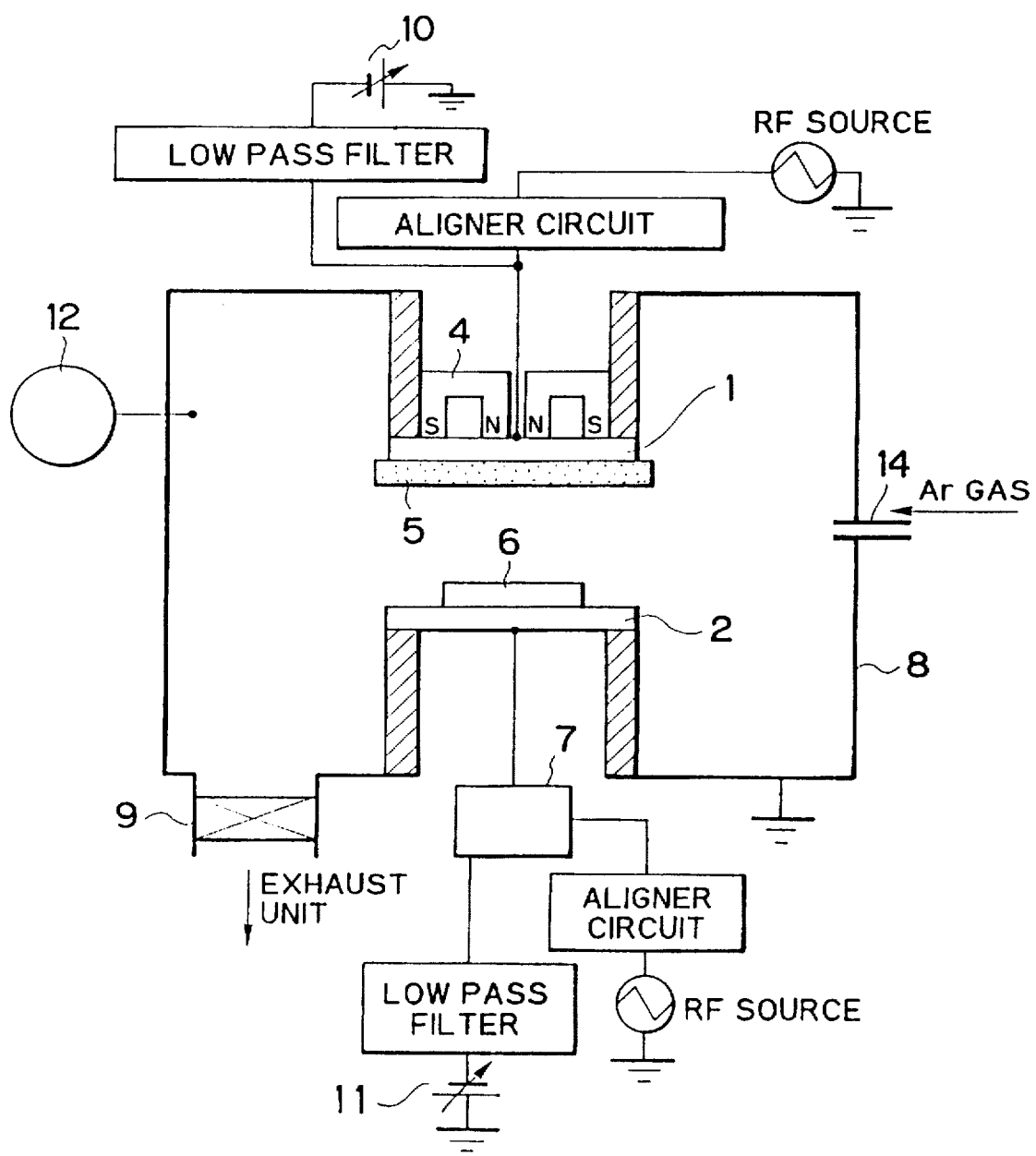
FIG. 8 is a conventional plasma processing apparatus without a shielding plate.

A film forming apparatus having the arrangement shown in FIG. 8 was manufactured, which was capable of introducing an Ar gas into the vacuum container and had the same arrangement as that of Example 1 except that a shielding plate was not arranged. Aluminum deposition films were formed on silicon wafer substrates under the same conditions as those in Example 1 except that the pressure in the vacuum container during a film formation process was maintained at 7 mTorr by regulating a conductance valve 9 of an exhaust unit. The film formation rates at the respective value of applied power shown in Table 1 were measured.

Table 1 shows the measurement result.

Comparative Example 2

Aluminum deposition films were formed on silicon wafer substrates by using a film forming apparatus including a cylindrical shielding plate having an inner diameter $d_2$ of 150 mm in place of the one used in Example 1 under the same conditions as those in Example 1 except that both the pressures in the film formation region $S_1$ and the region $S_2$ were set to be substantially 7 mTorr. The film forming rates at the respective values of applied power were measured.

Table 1 shows the measurement result.

TABLE 1

| Applied RF Power (W) | Film Formation Rate (Å/min) | | |
|---|---|---|---|
| | Example 1 | Comparative Example 1 | Comparative Example 2 |
| 40 | 182 | 170 | 175 |
| 80 | 350 | 280 | 291 |
| 100 | 442 | 350 | 362 |
| 120 | 530 | 403 | 415 |
| 140 | 618 | 431 | 448 |

It is apparent from Table 1 that in Example 1, the film formation rate almost linearly increases with an increase in applied power, and hence the applied power is efficiently used for the formation of a film by effectively suppressing a loss in applied power.

In contrast to this, in Comparative Example 1, a loss in applied power is increased due to the expansion of a discharge region outside the inter-electrode space, so that at the same applied power, the film formation rate is decreased as compared with that in Example 1. In addition, the rate of decrease in film formation rate is increased with an increase in applied power. When no shielding plate is used, the applied power loss is increased at high applied power values.

Although the film formation rate in Comparative Example 2 is increased as compared with that in Comparative Example 1, it is not as high as that in Example 1 wherein a pressure difference is set between the film formation region $S_1$ and the region $S_2$. That is, a loss in applied power in Comparative Example 2 is higher than that in Example 1.

Example 2

A silicon deposition film was formed on a silicon wafer substrate by using an apparatus having the same arrangement as that of Example 1 under the following conditions, in accordance with the same procedure as that in Example 1:

Target material: disk-like silicon wafer (diameter: 90 mm; thickness: 5 mm)

Substrate: disk-like silicon wafer (diameter: 50 mm; thickness: 0.4 mm)

RF power (applied to cathode 1):
100 MHz, 100 W

DC voltage:
−200 V to cathode 1
+5 V to anode 2

Ar gas introduction flow rate: 30 SCCM

Pressure in film formation region $S_1$: 7 mTorr

Pressure in region $S_2$: 0.1 Torr

Substrate temperatures: values shown in Table 2

The crystal state of each obtained silicon deposition film (thickness: 1,000 Å) was checked by using its electron beam analysis image. Table 2 shows the result.

Comparative Example 3

Silicon deposition films (thickness: 1,000 Å) were formed on silicon wafer substrates by using an apparatus having the same arrangement as that in Comparative Example 1 under the same conditions as those in the second embodiment except that the pressure in the vacuum container was maintained at 7 mTorr by regulating a conductance valve 9 of an exhaust unit. The crystallinity of each deposition film at each substrate temperature shown in Table 2 was checked.

As is apparent from Table 2, in Example 2, a deposition film with excellent crystallinity can be obtained at a temperature lower than that in Comparative Example 2.

TABLE 2

|  | Substrate Temperature (°C.) | | | | | |
| --- | --- | --- | --- | --- | --- | --- |
|  | 210 | 220 | 240 | 250 | 300 | 350 |
| Example 2 | x | o | ⊚ | ⊚ | ⊚ | ⊚ |
| Comparative Example 3 | x | x | x | o | o | ⊚ | electronic diffraction image
thickness of Si film: 1,000 Å
⊚: Kikuchi line
o: streak
x: halo Example 3

Silicon deposition films were formed on silicon wafer substrates by using a film forming apparatus shown in FIG. 7, which had the same arrangement as that of Example 1 and had a DC power source 16 connected to a shielding plate of the apparatus through an LPF, under the following conditions, in accordance with the same procedure as that in Example 1:

Target material: disk-like silicon wafer (diameter: 90 mm; thickness: 5 mm)

Substrate: disk-like silicon wafer (diameter: 50 mm; thickness: 0.4 mm)

RF power (applied to cathode 1): 100 MHz, 100 W

Figure 9:
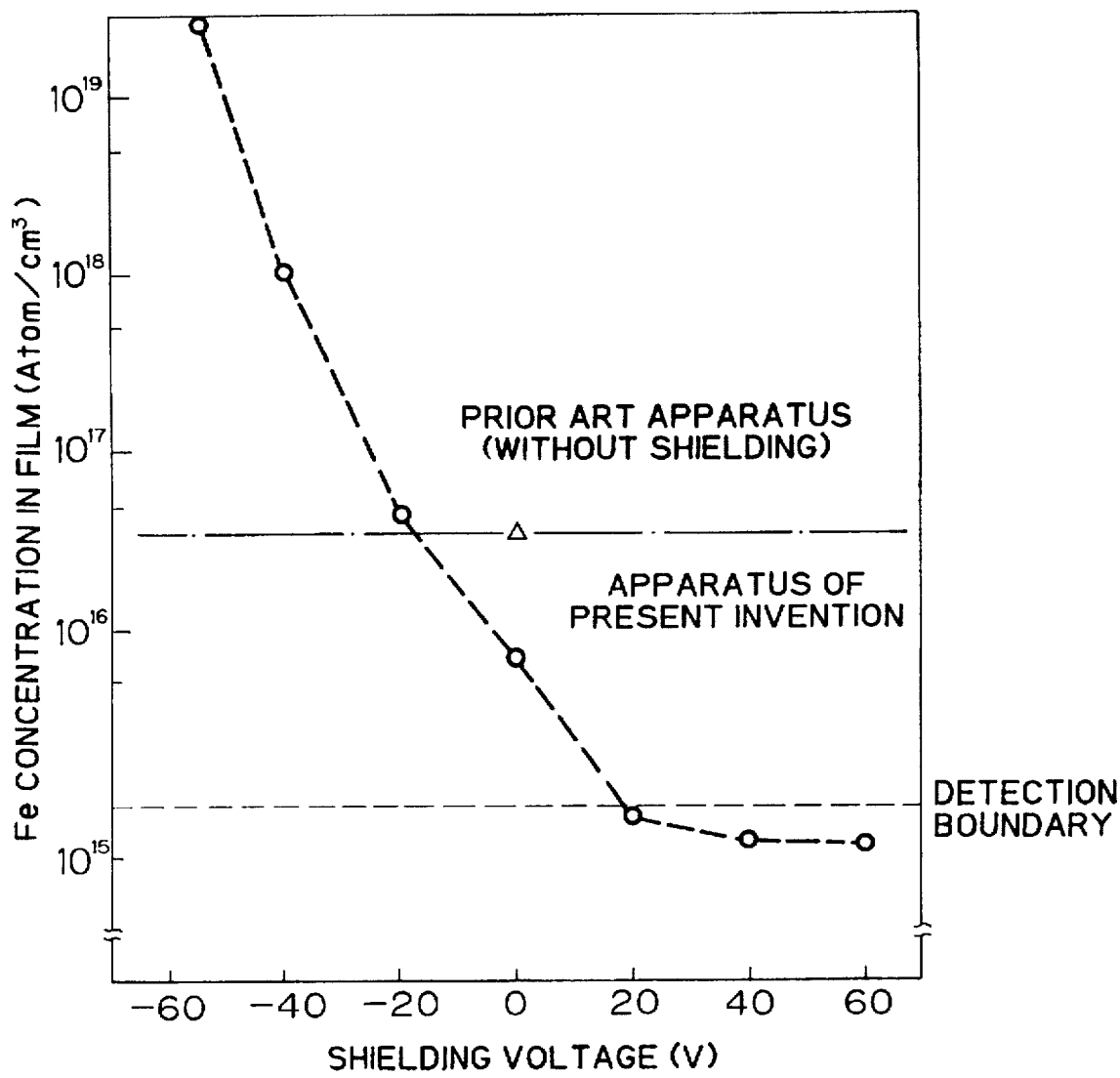
FIG. 9 is a graph showing the relationship between the amount of Fe contained in a film and a shielding voltage to be applied to a shielding plate.

DC voltage (shielding voltage applied to shielding plate): values shown in FIG. 9

Ar gas introduction flow rate: 30 SCCM

Pressure in film formation region $S_1$: 7 mTorr

Pressure in region $S_2$: 0.1 Torr

Substrate temperature: 250° C.

Film thickness: 1,000 Å

The amounts of Fe mixed with the respective deposition films when the shielding voltage was changed were measured by the SIMS method. FIG. 9 shows the result. As shown in FIG. 9, in the apparatus of this embodiment, by increasing the DC voltage applied to the shielding plate from a negative value to a positive value, the mixing amount of Fe can be reduced. Upon application of a voltage of 0 V, the mixing amount of Fe can be suppressed to be lower than that of the deposition film obtained by the apparatus of Comparative Example 3. At a voltage of 20 V or more, the mixing amount of Fe can be suppressed to a detection boundary or lower.

Comparative Example 4

Silicon deposition films (thickness: 1,000 Å) were formed on silicon wafer substrates by using a film forming apparatus having the same arrangement as that of Comparative Example 1 under the same conditions as those in Example 3 except that the pressure in the vacuum container during a film formation process was maintained at 7 mTorr by regulating a conductance valve of an exhaust unit. The amounts of Fe mixed with the respective deposition films were then measured by the SIMS method. As a result, larger mixing amounts of Fe than those in the respective Examples described above were detected.

In the plasma processing of each Example of the present invention, since a shielding plate is arranged to enclose a plasma processing region including the space between a pair of discharging electrodes, and a pressure difference is set between the plasma processing region and other regions, expansion of a discharge region generated between the electrodes to the outside of the space therebetween can be prevented. This allows the use of substantially the entire discharge region to generate a plasma required for a plasma process. As a result, an applied power loss can be suppressed to perform an efficient plasma process. In addition, since a sufficient plasma density is ensured, a proper plasma process can be performed.

What is claimed is:

1. A plasma processing apparatus having a vacuum container which comprises a cathode electrode and an anode electrode arranged in opposition to each other for causing a discharge for generating a plasma, and a shielding plate provided at outside of said electrodes for separating a plasma processing region including a space between said electrodes wherein said vacuum container has a first space defined by said shielding plate and said electrodes for forming said plasma processing region, and a second space defined by said shielding plate outside of the first space and an inner wall of said vacuum container, and said first and second spaces communicate with each other through a gap formed between said electrode and said shielding plate; and wherein a pressure regulating mechanism for regulating a continuity of a section connecting said first and second spaces, and an exhaust unit connecting section for exhausting said first and second spaces through said second space are provided, in order to form a pressure difference between said first and second spaces, so that a ratio ($P_{s1}/P_{s2}$) of a pressure ($P_{S1}$) in said first space to a pressure ($P_{S2}$) in said second space falls within a range of 5 to 100.

2. An apparatus according to claim 1, further comprising means for applying a voltage to said shielding plate.

3. An apparatus according to claim 2, wherein, a power source is a D.C. power source, and is connected to said shielding plate through a low pass filter.

4. An apparatus according to claim 1, further comprising a magnetic field generating means arranged at a side opposite to a side of said first space of said cathode electrode.

5. An apparatus according to claim 1, wherein said pressure regulating mechanism comprises a regulation valve for regulating a communicating state between said first and second spaces.

6. An apparatus according to claim 1, wherein said pressure regulating mechanism includes a mechanism for moving said shielding plate.

7. An apparatus according to claim 6, wherein said pressure regulating mechanism has a mechanism for movably supporting said shielding plate.

8. An apparatus according to claim 6, wherein said shielding plate has a mechanism for moving part thereof.

9. An apparatus according to claim 8, wherein said mechanism for moving moves to form an opening at said shielding plate.

10. An apparatus according to claim 1, wherein a load lock chamber is connected to said vacuum container.

11. An apparatus according to claim 1, wherein said plasma processing apparatus is used for sputtering.

12. An apparatus according to claim 1, wherein a gas introducing inlet is provided in said first space.

13. An apparatus according to claim 1, further comprising a pressure meter for measuring pressure in said first and second spaces.

14. An apparatus according to claim 1, wherein said exhaust unit connecting section is connecting an exhaust unit through a conductance valve.

15. An apparatus according to claim 1, wherein said shielding plate has a length longer than a distance between said cathode electrode and anode electrode in a direction from said cathode electrode toward said anode electrode.

16. An apparatus according to claim 1, further comprising a pressure regulating valve for regulating a size of the gap.

17. An apparatus according to claim 16, wherein said valve is movable using a bellows.

18. A plasma processing apparatus comprising:

anode and cathode electrodes arranged at opposite sides;

a shielding plate arranged at a periphery of a space sandwiched by said cathode and anode electrodes arranged at opposite sides, having a length longer than a distance between said electrodes, and spaced from said electrodes by a gap;

a vacuum container containing therein said anode and cathode electrodes and said shielding plate, wherein said vacuum container has a first space forming a plasma processing region defined by said shielding plate and said cathode and anode electrodes arranged at opposite sides, and a second space defined by said shielding plate and an inner wall of said vacuum container, and said first and second spaces communicate with each other through said gap;

a pressure regulating mechanisms for regulating an aperture or length of said gap;

an exhaust unit connecting section connected to said second space for exhausting said first and second spaces; and a gas introducing section for introducing a gas into said first space.

19. An apparatus according to claim 18, further comprising a pressure meter for measuring a pressure to regulate a ratio $(P_{S1}/P_{S2})$ of a pressure $(P_{S1})$ in said first space to a pressure $(P_{S2})$ in said second space within a range of 5 to 100.

20. An apparatus according to claim 18, further comprising a power source for applying a voltage to said shield plate.

21. An apparatus according to claim 20, wherein said power source is a D.C. power source.

22. An apparatus according to claim 21, wherein, said D.C. power source is connected to said shielding plate through a low pass filter.

23. An apparatus according to claim 18, further comprising a magnetic field generating means arranged at a side opposite to a side of said first space of said cathode electrode.

24. An apparatus according to claim 18, wherein said pressure regulating mechanism has a regulation valve for regulating the communicating state between said first and second spaces.

25. An apparatus according to claim 18, wherein said pressure regulating mechanism has a mechanism capable of moving at least a part of said shielding plate.

26. An apparatus according to claim 25, wherein said pressure regulating mechanism has a mechanism for movably supporting said shielding plate by a bellows.

27. An apparatus according to claim 25, wherein said shielding plate has a mechanism for moving part thereof.

28. an apparatus according to claim 18, wherein said exhaust unit connecting section is connecting an exhaust unit through a conductance valve.

29. A plasma processing apparatus comprising:

anode and cathode electrodes arranged at opposite sides;

a shielding plate with an aperture arranged at a periphery of a space sandwiched by said cathode and anode electrodes arranged at opposite sides, having a length longer than a distance between said electrodes, and spaced from said electrodes by a gap;

a vacuum container containing therein said anode and cathode electrodes and said shielding plate, wherein said vacuum container has a first space forming a plasma processing region defined by said shielding plate and said cathode and anode electrodes arranged at opposite sides, and second space defined by said shielding plate and an inner wall of said vacuum container, and said first and second spaces communicate with each other through said gap;

a pressure regulating mechanism having a member for regulating a size of the aperture of said shielding plate;

an exhaust unit connecting section connected to said second space for exhausting said first and second spaces; and a gas introducing section for introducing a gas into said first space.

* * * * *

UNITED STATES PATENT AND TRADEMARK OFFICE
CERTIFICATE OF CORRECTION

PATENT NO. : 5,728,278
DATED : March 17, 1998
INVENTOR(S) : NOBUYUKI OKAMURA ET AL.

It is certified that error appears in the above-identified patent and that said Letters Patent is hereby corrected as shown below:

On the title page, item [73] Assignee:

"Canon Kabushiki Kaisha/Applied Materials Japan, Inc., Tokyo, Japan" should read
--Canon Kabushiki Kaisha and Applied Materials Japan, Inc., both of Tokyo, Japan--.

COLUMN 9

Line 36, "mechanisms" should read --mechanism--.

Signed and Sealed this

Seventeenth Day of August, 1999

Attest:

Q. TODD DICKINSON

*Attesting Officer*     *Acting Commissioner of Patents and Trademarks*